United States Patent
Song et al.

(10) Patent No.: US 10,119,535 B2
(45) Date of Patent: Nov. 6, 2018

(54) PUMP CONTROL SYSTEM WITH ISOLATED AC VOLTAGE DETECTOR

(71) Applicant: Franklin Electric Co., Inc., Fort Wayne, IN (US)

(72) Inventors: Wei Song, Fort Wayne, IN (US); Robert Wetekamp, Fort Wayne, IN (US)

(73) Assignee: Franklin Electric Co., Inc., Fort Wayne, IN (US)

( * ) Notice: Subject to any disclaimer, the term of this patent is extended or adjusted under 35 U.S.C. 154(b) by 0 days.

(21) Appl. No.: 14/602,847

(22) Filed: Jan. 22, 2015

(65) Prior Publication Data

US 2016/0102663 A1 Apr. 14, 2016

Related U.S. Application Data

(60) Provisional application No. 62/063,691, filed on Oct. 14, 2014, provisional application No. 62/065,364, filed on Oct. 17, 2014.

(51) Int. Cl.
| | | |
|---|---|---|
| *G01R 31/42* | (2006.01) | |
| *F04B 49/06* | (2006.01) | |
| *F04B 17/04* | (2006.01) | |
| *F04B 49/10* | (2006.01) | |
| *G01R 19/175* | (2006.01) | |
| *G01R 31/28* | (2006.01) | |

(52) U.S. Cl.
CPC ............ *F04B 49/06* (2013.01); *F04B 17/04* (2013.01); *F04B 49/10* (2013.01); *F04B 49/103* (2013.01); *G01R 19/175* (2013.01); *G01R 31/2837* (2013.01); *G01R 31/42* (2013.01)

(58) Field of Classification Search
CPC ........ F04B 49/06; F04B 17/04; F04B 49/103; H03K 3/012; H03K 3/017
See application file for complete search history.

(56) References Cited

U.S. PATENT DOCUMENTS

| | | | |
|---|---|---|---|
| 3,282,219 A | 11/1966 | Blackwell et al. | |
| 4,219,863 A | 8/1980 | Takeshima | |
| 4,602,484 A * | 7/1986 | Bendikson | F25B 49/02 361/22 |
| 4,964,609 A | 10/1990 | Tomell | |
| 4,964,786 A | 10/1990 | Maertens | |
| 5,100,304 A | 3/1992 | Osada et al. | |

(Continued)

OTHER PUBLICATIONS

"The Complete Range of Condensate Removal Pumps", Sauermann, Feb. 2005, 12 pages.
"Installer's Handbook", Sauermann, Aug. 15, 2008, 36 pages.
"Thyristor Theory and Design Consideration—Handbook", Semiconductor Components Industries, LLC, Nov. 2006, pp. 93-104.
"Liquid Level Control Using a Pressure Sensor" Freescale Semiconductor, Inc., May 2005, pp. 1-8.

*Primary Examiner* — Muhammad S Islam
(74) *Attorney, Agent, or Firm* — Faegre Baker Daniels LLP

(57) ABSTRACT

A pump and a method of operating the pump at a duty-cycle based on the input voltage of the power source energizing the pump. The pump includes at least a first opto-coupler electrically coupled to the power source. The method includes detecting at least a first opto-coupler state transition; determining a zero-crossing of the input voltage; determining an elapsed time between the zero-crossing and the first opto-coupler state transition; and operating the pump by energizing a power switch at a duty-cycle based on the elapsed time.

19 Claims, 7 Drawing Sheets

(56) References Cited

U.S. PATENT DOCUMENTS

| | | | |
|---|---|---|---|
| 5,583,423 A * | 12/1996 | Bangerter | G05F 1/45 323/211 |
| 5,790,391 A | 8/1998 | Stich et al. | |
| 6,174,136 B1 | 1/2001 | Kilayko et al. | |
| 6,283,717 B1 | 9/2001 | Yamada | |
| 7,001,158 B2 | 2/2006 | Dunn | |
| 7,755,318 B1 * | 7/2010 | Panosh | F04B 49/065 318/778 |
| 8,182,243 B2 | 5/2012 | Ward | |
| 8,901,771 B2 * | 12/2014 | Mancebo del Castillo Pagola | H02M 5/42 307/64 |
| 2003/0202368 A1 * | 10/2003 | Ierymenko | H02M 1/4208 363/125 |
| 2005/0253744 A1 * | 11/2005 | Kern | H03M 1/005 341/110 |
| 2006/0210410 A1 | 9/2006 | Mokler | |
| 2009/0218971 A1 * | 9/2009 | Jeung | H02P 6/085 318/400.17 |
| 2010/0213886 A1 * | 8/2010 | Cheng | H02P 27/16 318/812 |
| 2011/0217183 A1 | 9/2011 | Piai et al. | |
| 2013/0269800 A1 | 10/2013 | Fromont | |
| 2014/0132246 A1 * | 5/2014 | Schwind | G01R 25/00 324/76.82 |

\* cited by examiner

PUMP CONTROL SYSTEM WITH ISOLATED AC VOLTAGE DETECTOR

CROSS-REFERENCE TO RELATED APPLICATIONS

This application claims the benefit of priority from U.S. Provisional Patent Application No. 62/063,691, filed Oct. 14, 2014, and U.S. Provisional Patent Application No. 62/065,364, filed Oct. 17, 2014; the disclosures of said applications are expressly incorporated herein by reference their entireties.

TECHNICAL FIELD

The present invention relates to pump controls and more particularly to methods and systems for detecting characteristics of an alternating current power source for a pump control system.

BACKGROUND OF THE DISCLOSURE

Pumps are generally designed to operate at a nominal input voltage. A solenoid pump is an exemplary pump, which operates by energizing a solenoid to move a plunger back and forth within a cylinder to draw fluid from an inlet and discharge the fluid through an outlet of the cylinder. The energy applied to the solenoid determines how fast and for how long the plunger operates. If the energy exceeds a nominal amount, the plunger can reach its physical travel limit while energized, potentially reducing the life expectancy of the pump and wasting energy.

To enable a single voltage rated solenoid pump to operate at both nominal input voltages of 115 VAC and 230 VAC, the power delivered to the pump must be regulated. One method for regulating the alternating current (AC) power is by controlling conduction of a triode for alternating current (TRIAC) that energizes the solenoid as a function of the nominal input voltage so that power is not delivered during the entire positive half-cycle of the source power when the nominal input voltage is 230 VAC.

Prior approaches to detect the nominal input voltage used linear transformers to step-down the AC input voltage and voltage dividers to determine the voltage on the secondary winding of the transformer, which is then converted by the step-down factor to determine the nominal input voltage. Such transformers, however, are large (especially those rated up to 230 VAC) and may not be suitable for use in constrained spaces such as in mini-condensate pump applications. In another approach, a voltage divider is connected directly to the AC input voltage. However, such approach does not provide electrical isolation between the power circuit and the control circuit. Accordingly, an approach to nominal input voltage detection that overcomes these deficiencies is desirable.

SUMMARY OF THE DISCLOSURE

A pump and a method of operating the pump based on the input voltage of a power source energizing the pump are provided. In embodiments of the method and system disclosed herein, the pump includes an opto-coupler electrically coupled to the power source. Advantageously, output signals from the opto-coupler, which are used by control logic to determine the duty-cycle of a power switch driving the pump, are isolated from the input voltage without use of a linear transformer. Smaller and safer pumps, such as condensate pumps used to evacuate liquid condensate from liquid reservoirs in homes, can be constructed using the control circuits described herein.

In one embodiment, a method of operating a pump comprises detecting at least a first opto-coupler state transition of a first opto-coupler electrically coupled to a power source coupled to the pump; determining a zero-crossing of an input voltage of the power source; determining an elapsed time between the zero-crossing and the first opto-coupler state transition; and operating the pump by energizing a power-switch at a duty-cycle based on the elapsed time.

In one variation of the present embodiment, the method further comprises selecting from a plurality of first values a first value corresponding to the elapsed time, and the duty-cycle is based on a second value from a plurality of second values, wherein the second value is associated with the first value.

In another variation of the present embodiment, the method further comprises detecting a second opto-coupler state transition, and using the second opto-coupler state transition to determine the zero-crossing. In one example, the first opto-coupler state transition comprises a first transition by the first opto-coupler and the second opto-coupler state transition comprises a first transition by a second opto-coupler. In another example, the duty-cycle is greater than 40% when the input voltage is less than 140 VAC and is less than 40% when the input voltage is greater than 140 VAC.

In another embodiment, the pump comprises an opto-coupler electrically coupled to a power source; and a first diode connected to block current from the power source to the opto coupler during a positive half cycle of an input voltage of the power source until the input voltage exceeds a breakdown voltage of the first diode, the opto-coupler transitioning from a first state to a second state responsive to current flow through the first diode and transitioning from the second state to the first state responsive to the current ceasing to flow through the first diode. The pump further comprises a power switch electrically coupled to the power source; and control logic structured to determine an elapsed time between a zero-crossing of the input voltage and the opto-coupler transitioning from the first state to the second state, the control logic further structured to activate the power switch at a duty-cycle corresponding to the elapsed time.

In one variation of the present embodiment, the pump comprises a second opto-coupler electrically coupled to the power source; and a second diode connected to block current flow to the second opto-coupler during a negative half-cycle of the input voltage. An output signal of the second opto-coupler indicates the zero crossing of the input voltage.

In another embodiment, a control circuit is provided. The control circuit comprises a first opto-coupler electrically coupled to a power source and a second opto-coupler electrically coupled to the power source. The control circuit further comprises a first diode and a second diode. The first diode is coupled to activate the first opto-coupler in response to an input voltage of the power source exceeding a breakdown voltage of the first diode during a positive half-cycle of the input voltage, the first opto-coupler providing a first output signal responsive to said activation. The second diode is coupled to activate the second opto-coupler in response to a zero crossing of the input voltage, the second opto-coupler providing a second output signal responsive to said activation. The control circuit further comprises control logic structured to activate a power switch at a duty-cycle based on an elapsed time between the first output signal and the second output signal.

BRIEF DESCRIPTION OF THE DRAWINGS

Embodiments of the present invention will now be described, by way of example only, with reference to the accompanying drawings, in which.

DETAILED DESCRIPTION OF DISCLOSED EMBODIMENTS

The embodiments described below are merely exemplary and are not intended to limit the invention to the precise forms disclosed. Instead, the embodiments were selected for description to enable one of ordinary skill in the art to practice the invention.

Figure 1:
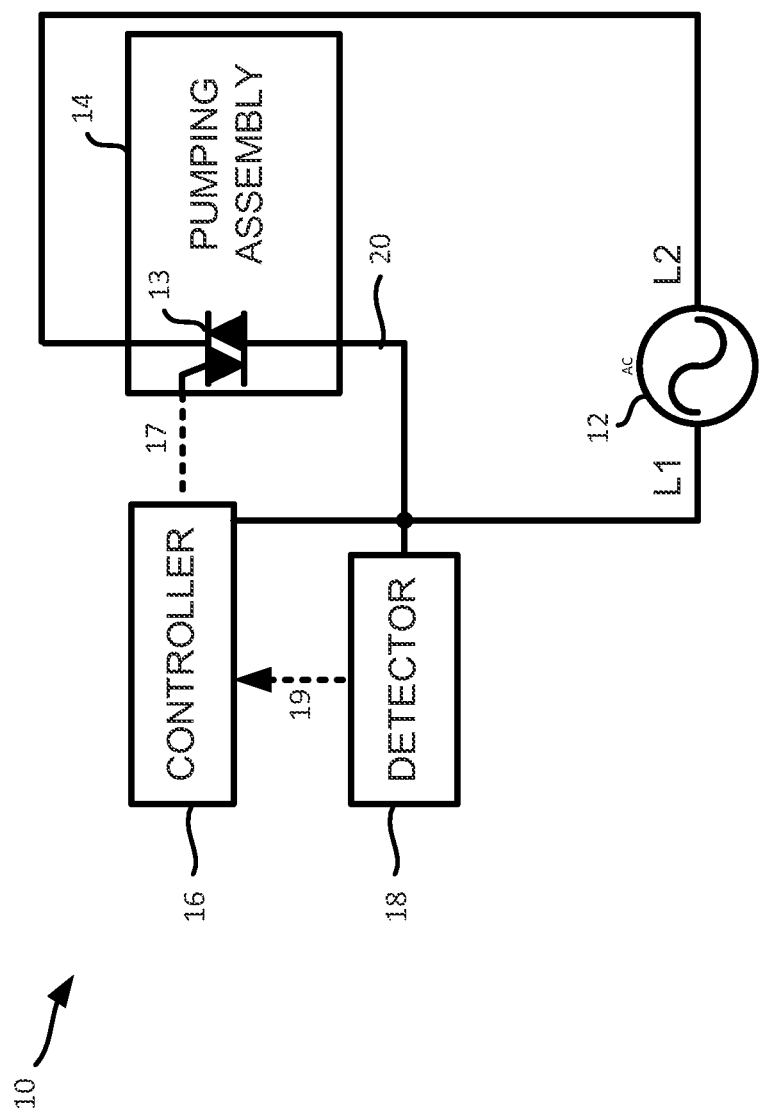
FIG. 1 is block diagram of a pump system having a detector according to the principles of the present disclosure.

Referring now to FIG. 1, a system 10 includes a power source 12 connected to a TRIAC 13 which energizes a pumping assembly 14 and a controller 16 that outputs a switching signal 17 that controls the operation of TRIAC 13. System 10 also includes a detector 18 that senses or detects characteristics of the AC power provided by power source 12, e.g. input voltage 20, and generates output signals 19 responsive to said sensing or detecting. Controller 16 uses output signals 19 to generate switching signal 17 and thereby adjust the on-time of TRIAC 13 to energize pumping assembly 14 based on the detected characteristic of the AC power. Switching signal 17 may be based in part on input signals (not shown) corresponding to a user input, a fluid level, a fluid pressure, and other signals well known for the application in which system 10 is used. Exemplary detectors are described with reference to FIGS. 3 and 4. In one embodiment of system 10, controller 16, detector 18, pumping assembly 14, and TRIAC 13 are enclosed in a housing and may collectively be referred to as a pump. It should be understood that while TRIAC 13 is shown in pumping assembly 14, TRIAC 13, and more generally a power switch, may be located separate from pumping assembly 14. In one variation of the present embodiment, the pump comprises a solenoid pump, and pumping assembly 14 and TRIAC 13 are configured to energize a solenoid of the solenoid pump to cause cyclical linear displacement of a plunger within a cylinder having an inlet and an outlet, which linear displacement draws fluid through the inlet and discharges the fluid through the outlet of the cylinder. In another variation thereof, pumping assembly 14 comprises a motor coupled to an impeller which rotates to pump the fluid when the motor is energized by TRIAC 13. As is known in the art, once a TRIAC is activated, it remains activated until the end of the positive half-cycle of the AC voltage. Thus, it is not necessary to maintain gate current flow during the entire on-time of the TRIAC, it is sufficient to pulse an activation signal, which is simpler to do. However, it should be understood that TRIAC 13 is an exemplary power switch, and in further variations of the present embodiment other types of power switches may be employed, including thyristors, silicone controlled rectifiers (SCRs), insulated-gate bipolar transistors (IGBTs) and metal oxide semiconductor field-effect transistors (MOSFETs).

Figure 2:
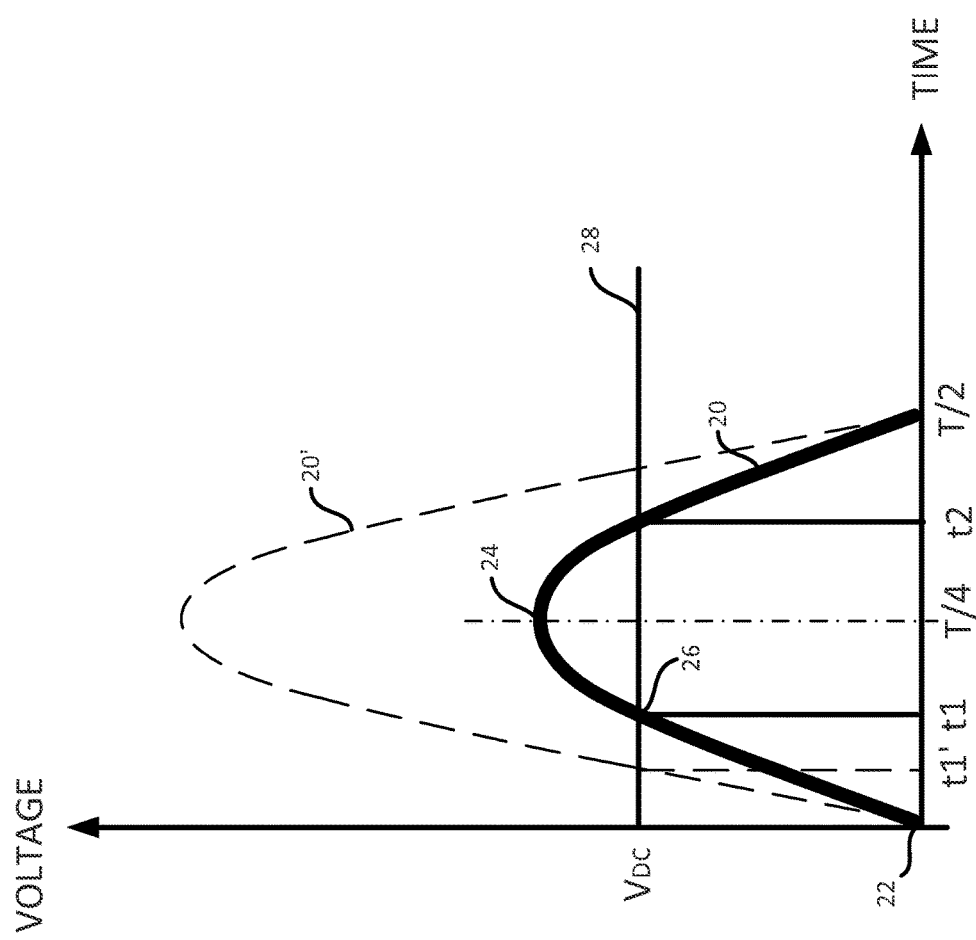
FIG. 2 is graphical representation of an input voltage from an AC power source.

As shown in FIG. 2, input voltage 20 is a sinusoid, which is positive for one-half cycle and negative for one-half cycle. Only the positive half-cycle is shown. The amplitude of input voltage 20 varies between 0 VAC at a zero-crossing 22 that occurs at time=0 to a maximum voltage 24 that occurs at a 90° phase angle at T/4, where T represents the period of the sinusoid. Input voltage 20 corresponds to a first nominal input voltage, e.g. 115 VAC. Also shown in FIG. 2 is an input voltage 20' corresponding a second nominal input voltage, e.g. 230 VAC. Input voltage 20' rises more quickly than input voltage 20, therefore a time t1' at which input voltage 20' crosses a threshold amplitude $V_{DC}$ 28 occurs sooner than a time t1 at which input voltage 20 crosses threshold amplitude $V_{DC}$ 28. A pump may be powered by input voltage 20 and an identical pump may be powered by input voltage 20', yet both pumps must operate in a similar manner by providing substantially the same amount of energy to pumping assembly 14. Controller 16 controls the power switch to deliver a predetermined amount of energy as a function of the nominal input voltage which is correlated to the elapsed times t1 and t1'.

Figure 7:
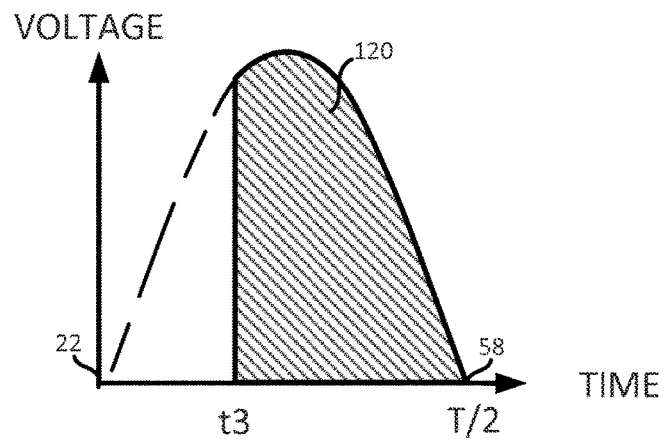
FIGS. 7 and 8 are graphical representations of timing for delivering a predetermined amount of energy in accordance with exemplary circuits provided herein.
Figure 8:
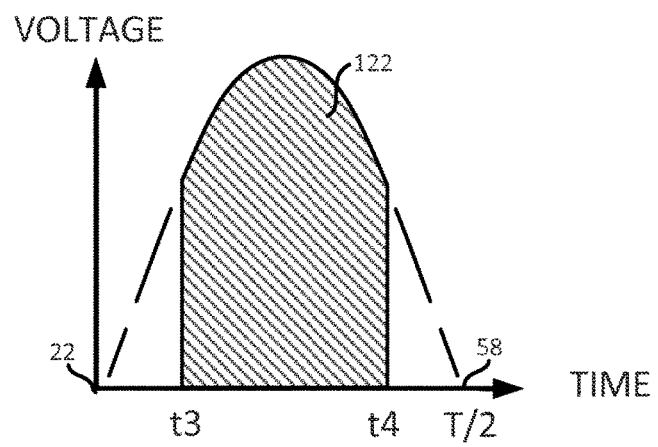

According to one embodiment of the present disclosure, detector .18 generates output signals 19 when the amplitude of input voltage 20, 20' exceeds threshold amplitude $V_{DC}$ 28 (starting at point 26 for input voltage 20). Controller 16 determines t1, t1' based on output signals 19, and based thereon determines an appropriate on-time for the power switch to provide a predetermined amount of energy to pumping assembly 14. The predetermined amount of energy may be described by area 120, 122 under the curve representing input voltage 20, 20' as shown in FIGS. 7 and 8. As shown therein, the predetermined amount of energy may be defined by area 120 between t3 and a trailing zero-crossing, e.g. zero-crossing 58, or as defined by area 122 between t3 and t4, by selection of the power switch and selective activation and deactivation of switching signal 17, e.g. at t3 and t4, and if necessary at zero-crossings 22 and 58. For example, an IGBT can be controlled to conduct current when its gate receives a current trigger. Thus, the on-time of the gate controls the on-time of the IGBT.

The nominal input voltage is uniquely related to the elapsed time between zero-crossing 22 and the threshold crossing. Accordingly, after time t1 is determined (t1 is the time between zero-crossing 22 and threshold crossing 26), the value of the nominal input voltage can be determined. In one embodiment, exemplified by area 120 shown in FIG. 7, the time t1 may be converted to a TRIAC trigger delay time t3 using a parameter table stored in a memory device (e.g., memory associated with controller 16). The table may be constructed through testing of optimal pump performance in terms of flow rate and temperature rise (which is related to the lifespan of pumping assembly 14). When t1 is detected, an associated trigger delay time t3 is determined. In one example, the input voltage is divided into AC input voltage zones, which is a division on the scale of the amplitude of input voltage 20, and a delay time t3 is predetermined for each zone. When t1 is detected, the TRIAC delay time t3 for the corresponding zone is looked up in the table and executed by controller 16. Since the associations between detected t1s and AC input voltage zones are unique, the conversion can be done directly from t1 to TRIAC delay time. Thus, for input voltage 20' a delay time is determined based on t1', and because input voltage 20' is larger than input voltage 20, the delay time will be larger than delay time t3. In one example, the delay time t3 for input voltage 20, e.g. 120 VAC, is zero, and the full half-cycle of energy is provided to the pump assembly. In an analogous manner the power switch may be energized until a delay time t4 as shown in FIG. 8. Of course, the predetermined amount of energy may be described by any desired area based on selection of delay times for engaging and disengaging the power switches in accordance with the teachings herein, during the positive half-cycle of the input voltage and during both the positive and the negative half-cycles of the input voltage, as required by the pump being driven by the input voltage, such as solenoid and motor driven pumps. While a substantially infinite number of zones can be defined, a practical application requires only a few zones corresponding to standard voltages and frequencies used in most countries, such as 110 VAC, 130 VAC, 220 VAC, 230 VAC, 50 Hertz and 60 Hertz. Of course additional zones may be included, for example if generators are used to provide non-standard power.

In another variation, the table includes a plurality of first values including a first value corresponding to the elapsed time, and a plurality of second values. Each first value is associated with a second value from the plurality of second values. Thus, upon determining the elapsed time and finding the first value, the associated second value is read from the table. In one example, the second value is a delay time t3 for activating the power switch. Delay time t3 sets a duty-cycle of the power switch. Thus, if delay time t3 corresponds to a 90° phase angle, the duty-cycle of the power switch will be 25% because the power switch will have an on-time of 25%. Alternatively, the power switch may be gated to automatically turn on with a leading zero-crossing, and to turn off based on the second value as described with reference to FIG. 8. The table may also include a plurality of third values associated with the first values. The third values may define a time t4, such that a second value defines when the power switch is turned on and the associated third value defines when the power switch is turned off, thereby setting the duty-cycle of the power switch. In one example, the duty-cycle is greater than 40% when the nominal input voltage is less than 140 VAC and is less than 40% when the nominal input voltage is greater than 140 VAC. Thus, if the nominal input voltage is 130 VAC, the duty-cycle may be substantially 50% if the power switch is turned on during the entire positive half-cycle and may be 25-35% if the nominal input voltage is 230 VAC. In an embodiment in which the pump comprises a solenoid pump, the solenoid is activated by the power switch at the same duty-cycle.

Input waveform 20 may be represented by the equation $$V_{DC} = (V_{rms}\sqrt{2}) \times \sin(\omega t_1) \text{ where} \quad (1)$$

$$V_{rms} = \frac{V_{DC}}{\sqrt{2}\sin(\omega t_1)}. \quad (2)$$

Equation (2) demonstrates that when $V_{DC}$ is constant and the frequency is fixed, then the nominal input voltage, or Vrms, has an exclusive relationship to t1. In other words, when provided a measurement of t1, controller 16 can directly compute Vrms provided to pumping assembly 14. An exemplary circuit 30 for providing a mechanism for measuring t1 is depicted in FIG. 3.

Figure 3:
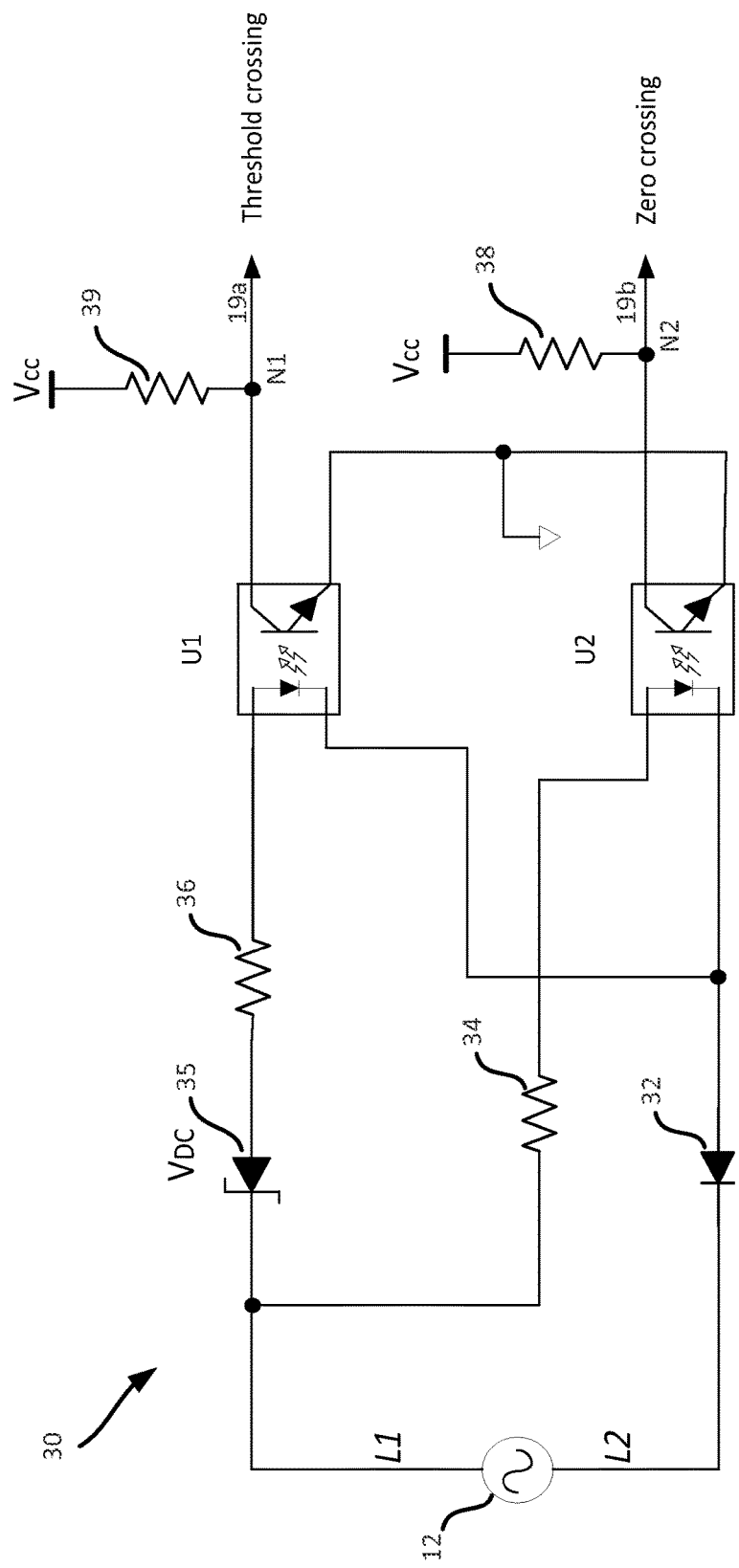
FIG. 3 is a schematic diagram of one embodiment of a circuit for detecting characteristics of the input voltage of FIG. 2.

As shown in FIG. 3, circuit 30 includes power source 12 depicted as having a positive half-cycle output when the potential of L1 is greater than L2 and a negative half-cycle output when the potential of L1 is less than L2. Circuit 30 comprises a threshold crossing detection circuit and a zero-crossing detection circuit. The threshold crossing detection circuit comprises diode 35, resistor 36, opto-coupler U1, diode 32 and resistor 39. An output signal 19a is output at node N1 and is further described with reference to FIG. 5. The zero-crossing detection circuit comprises resistor 34, opto-coupler U2, diode 32 and resistor 38. An output signal 19b is output at node N2. In operation and referring to the waveform of input voltage 20 of FIG. 2, after zero-crossing 22 but before threshold crossing 26, L1 has an amplitude that is less than the breakdown voltage $V_{DC}$ of diode 35 (which may be a Zener diode). During this time current flows through resistor 34 to activate U2, which then conducts current from DC voltage supply $V_{CC}$ through resistor 38 to ground, grounding node N2. However, current does not flow through U1, therefore node N1 is pulled high by resistor 39. Accordingly, before t1 output signal 19a is high and output signal 19b is low. When L1 exceeds the breakdown voltage of diode 35, current flows through diode 35 and resistor 36 to activate U1, which then conducts current from $V_{CC}$ through resistor 39 to ground node N1. At the same time U2 remains activated. Accordingly, after t1 output signal 19a is low and output signal 19b remains low. Controller 16 can therefore detect t1, corresponding to the threshold crossing, by detecting the transition in output signal 19a. However, before the negative half-cycle the input voltage falls below $V_{DC}$ at time t2, which controller 16 can detect by again detecting a transition on output signal 19a. The utility of t2 will be described below with reference to FIGS. 4 and 5. During the negative half-cycle output L2, diode 32 blocks current flow to both U1 and U2, and both opto-couplers are deactivated so that the outputs of U1 and U2 are pulled high by resistors 38 and 39. Controller 16 can therefore detect zero-crossings 22, 58 by detecting transitions in output signal 19b.

Thus, the output of opto-coupler U1 changes logic state when input voltage 20 crosses threshold $V_{DC}$ in the positive half cycle of the input voltage and the output of opto-coupler U2 changes logic state when the input voltage crosses zero at the beginning of the positive half-cycle and at the end of the positive half-cycle. The time lapse t1 between state transitions of U1 and U2 is measured by controller 16 based on these detected crossings. Since, as indicated above, t1 is exclusively related to Vrms of the input voltage, software of controller 16 uses t1 to look up the associated values to control the on-time of the power switch as described above.

Controller 16 may comprise a system-on-a-chip integrated circuit comprising memory and firmware. The firmware may include a table of values for t1 and associated values for t3 and t4 (shown in FIGS. 7-9). Alternatively, controller 16 may comprise memory and at least one of a field programmable gate array (FPGA), an application specific integrated circuit (ASIC), and a reduced instruction set computing (RISC) integrated circuit. More generally, controller 16 may comprise control logic implemented in software, firmware, hard-wired circuits, or a combination thereof.

Figure 4:
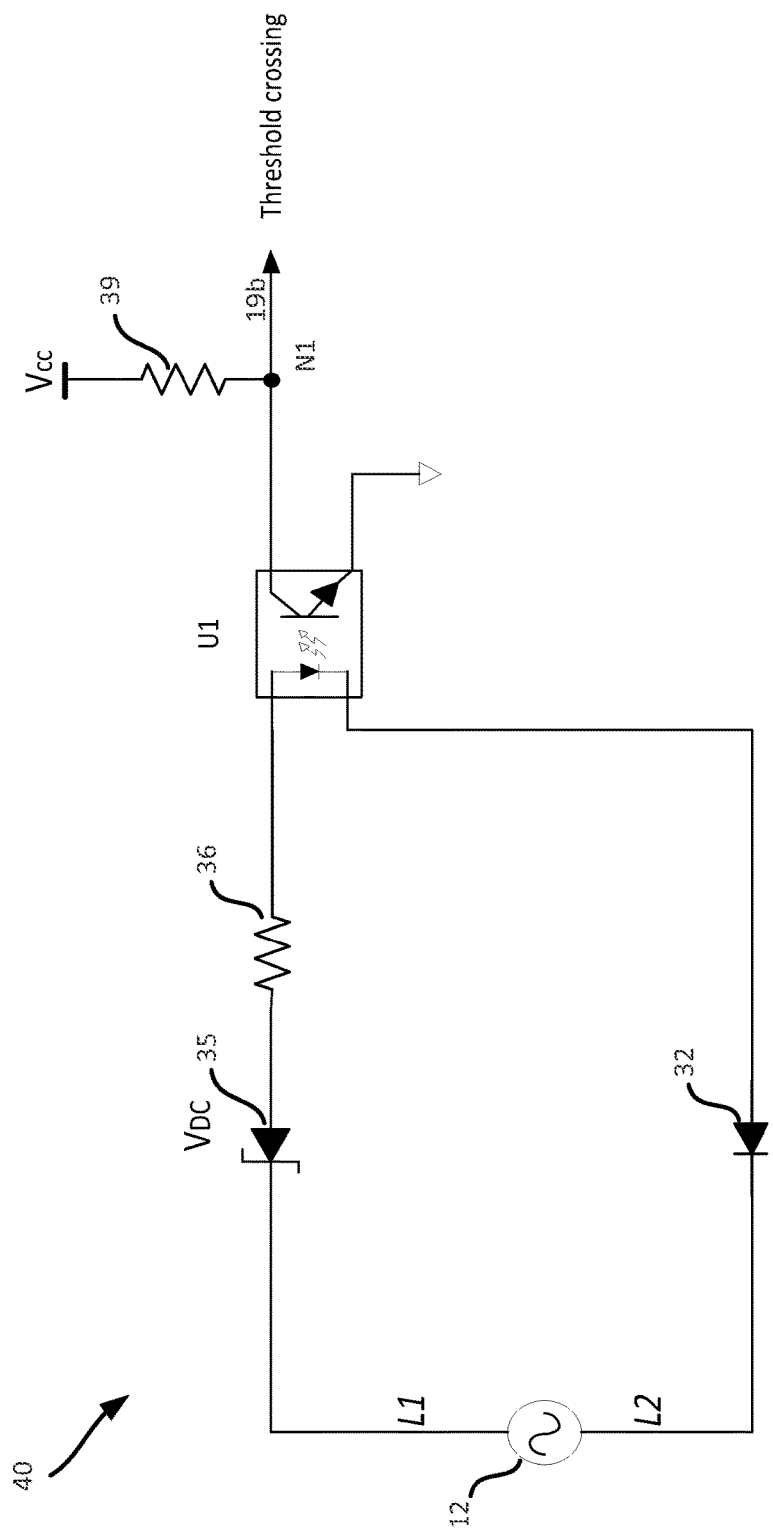
FIG. 4 is a schematic diagram of another embodiment of a circuit for detecting characteristics of the input voltage of FIG. 2.
Figure 5:
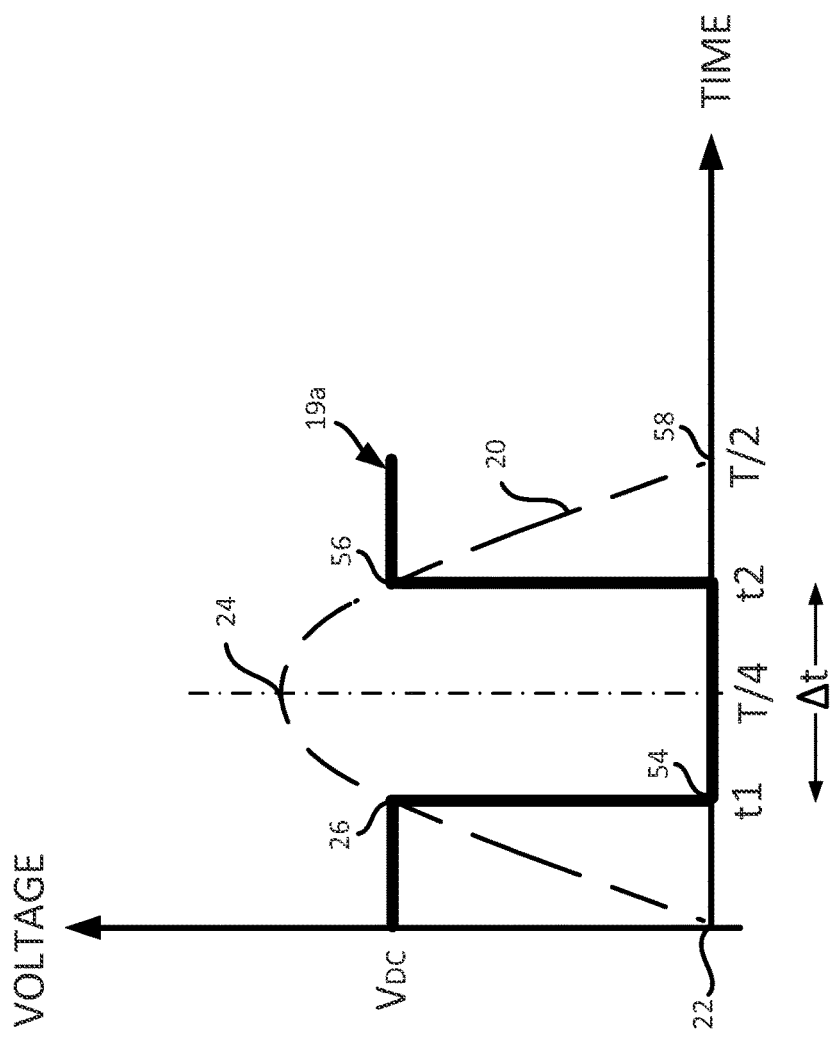
FIG. 5 is a graphical representation of an output signal of the circuit of FIG. 4.

FIG. 4 depicts an alternative circuit, denoted by numeral 40, for detecting characteristics of the input voltage. The operation of circuit 40 is further described with reference to FIG. 5, where line 19a represents the voltage of output signal 19a obtained at node N1. Circuit 40 is similar to circuit 30, without the zero-crossing circuit. While circuit 40 requires fewer components relative to circuit 30, it also requires that the zero-crossings of the input voltage be calculated, whereas the zero-crossings were directly detected by the zero-crossing circuit in circuit 30. As described with reference to FIGS. 3 and 5, in the present embodiment node N1 and output signal 19a are high except when the input voltage exceeds the breakdown voltage of diode 35 between times t1 and t2 during the positive half-cycle of the input voltage, as shown in FIG. 5 between points 26 and 56. For the remainder of the positive cycle after t2 and the negative cycle, output signal 19a remains in the high state. Controller 16 computes the time between t1 and t2 (i.e. Δt). The transitions at t1 and t2 are symmetrical about T/4, which corresponds to a 90° phase angle of the sinusoidal waveform.

The theory of operation of circuit 40 is as follows.

$$\Delta t = t_2 - t_1 \quad (3)$$

$$\frac{T}{2} = t_1 + t_2 \quad (4)$$

where, T is the AC period. Subtracting (4) from (3) results in, $$\Delta t = \frac{T}{2} - 2t_1 \quad (5)$$

$$= \frac{1}{2f} - 2t_1$$

where, f is the AC frequency, so that, $$t_1 = \frac{\frac{1}{2f} - \Delta t}{2} \quad (6)$$

Equation (6) indicates t1 is exclusively related to Δt when the frequency of input voltage 20, 20' is fixed. According to equation (2), Vrms of input voltage 20 is exclusively related to t1. Therefore, Vrms of input voltage 20 is exclusively related to Δt. For each Δt, controller 16 can obtain a corresponding Vrms value. Furthermore, controller 16 can determine the frequency f of input voltage 20 from equation (5) and the determined values of Δt and t1, and the time at zero-crossing 58 from equation (4) as T/2=t1+t2. Zero-crossing 22 can easily be determined once the frequency f has been determined. Pumping assembly 14 can then be regulated by manipulating the on-time of the power switch as described above with reference to FIGS. 3, 7, and 8, for example by reading from a look-up table values for t3 and/or t4 associated with the nominal input voltage corresponding to t1, t1' based on the elapsed time t1.

Figure 6:
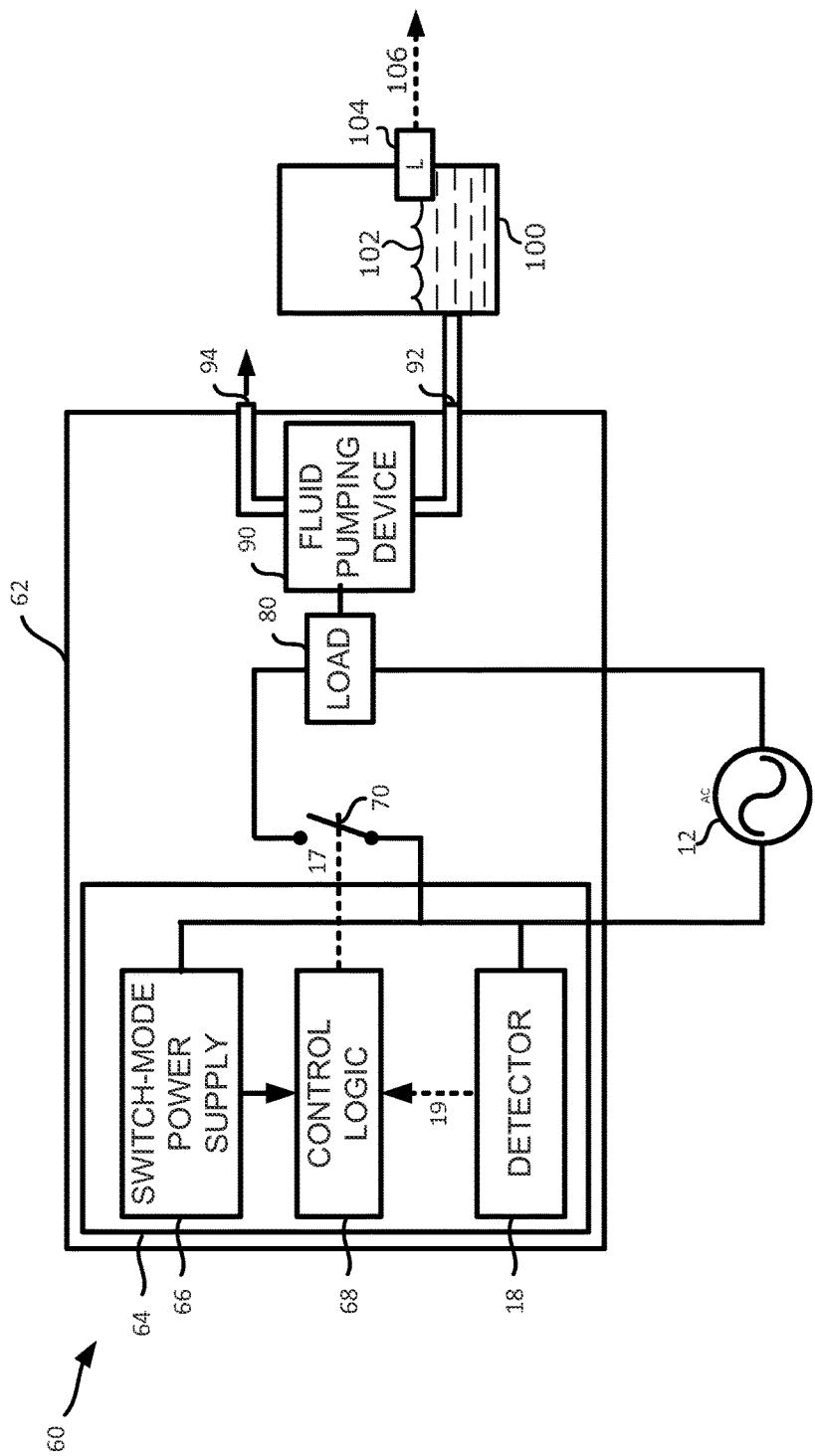
FIG. 6 is a schematic diagram of an embodiment of a pump system including a voltage detector according with embodiments of circuits for detecting characteristics of the input voltage as disclosed herein.

FIG. 6 is a block diagram of an embodiment of a pump 60 comprising detector 18. Pump 60 comprises a housing 62 enclosing a control system 64 including detector 18, control logic 68, and a switch-mode power supply 66 which provides control voltage to control logic 68 and detector 18. Control logic 68 is configured to perform the functions of controller 16 as described above and may be implemented on a system-on-a-chip integrated circuit, an FPGA, an ASIC, and a RISC integrated circuit, or any combination of software, firmware, and hard-wired circuits. As is well known in the art, a switch-mode power supply does not reflect the primary voltage linearly to the secondary voltage of a transformer, which advantageously isolates the input voltage from the control voltage, and therefore cannot be used to determine the nominal input voltage. Pump 60 further comprises a power switch 70 configured to perform functions described above with reference to TRIAC 13, a load 80, and a fluid pumping device 94. Exemplary loads include solenoids in solenoid pumps, motors, and any electrical device operable to drive a fluid pumping device. Exemplary fluid pumping devices include plungers in solenoid pumps, impellers in motor-driven pumping assemblies, and any other mechanical device driven electrically to displace a fluid. Fluid pumping device 90 has an inlet 92 fluidly coupled to a fluid reservoir 100 containing a fluid 102, and an outlet 94 for discharging the fluid suctioned through inlet 92. A level detector 104 outputs level signals 106 which control logic 68 uses to determine when to energize load 80 to pump fluid out of reservoir 100. Advantageously, control logic 68 is isolated from the input voltage provided by power source 12 by switch-mode power supply 66 and the opto-couplers of detector 18.

The above detailed description and the examples described therein have been presented for the purposes of illustration and description only and not by limitation. It is therefore contemplated that the present disclosure covers any and all modifications, variations or equivalents that fall within the spirit and scope of the basic underlying principles disclosed above and claimed herein.

What is claimed is:

1. A method of operating a pump based on a voltage of a power source powering the pump, the method comprising:
   detecting at least a first opto-coupler state transition of a first opto-coupler electrically coupled to the power source, the power source electrically coupled to a solenoid of the pump, the first opto-coupler having a positive input contact electrically connected to the power source and a negative input contact, and the first opto-coupler transitioning state responsive to current flowing from the power source through the positive input contact to the negative input contact of the first opto-coupler;
   detecting a second opto-coupler state transition;
   determining a zero-crossing of the voltage of the power source based on the second opto-coupler state transition;
   determining an elapsed time between the zero-crossing and the first opto-coupler state transition; and
   energizing the solenoid at a duty-cycle based on the elapsed time.

2. A method as in claim 1, further comprising selecting a first value corresponding to the elapsed time, and basing the duty-cycle on a second value associated with the first value.

3. A method as in claim 1, wherein the first opto-coupler state transition and the second opto-coupler state transition occur during a positive half-cycle of the voltage.

4. A method as in claim 1, further comprising blocking a current flow from the power source to the first opto-coupler until a voltage value of the voltage exceeds a breakdown voltage of a first diode.

5. A method as in claim 1, further comprising blocking a current flow from the power source to the second opto-coupler during a negative half-cycle of the voltage.

6. A method as in claim 1, wherein the duty-cycle is greater than 40% when the voltage is less than 140 VAC and is less than 40% when the voltage is greater than 140 VAC.

7. A method as in claim 1, wherein the pump comprises a solenoid pump including a switch-mode power supply powering control logic structured to determine the elapsed time.

8. A method as in claim 1, wherein the first opto-coupler includes an output contact configured to provide the first output signal.

9. A method as in claim 2, further comprising applying a gate current to a gate of a triode for alternating current (TRIAC) at a time corresponding to the second value to operate the pump.

10. A pump comprising:
an opto-coupler including an input side having an input positive contact and an input negative contact, the input positive contact adapted to be electrically coupled to a power source having a voltage;
a first diode connected to block current from the power source to the opto-coupler during a positive half-cycle of the voltage of the power source until the voltage exceeds a breakdown voltage of the first diode, the opto-coupler transitioning from a first state to a second state responsive to current flow through the input side of the opto-coupler and providing a first output signal responsive to said transition, and transitioning from the second state to the first state responsive to the current ceasing to flow through the input side of the opto-coupler;
a second opto-coupler providing a second output signal responsive to a zero-crossing of the voltage of the power source;
a second diode connected to block current flow from the power source to the second opto-coupler during a negative half-cycle of the voltage;
a solenoid adapted to be electrically coupled to the power source; and
a control logic structured to determine an elapsed time between the first output signal and the second output signal, the control logic further structured to activate the solenoid at a duty-cycle corresponding to the elapsed time.

11. A pump as in claim 10, further comprising memory having stored therein a first value corresponding to the elapsed time and a second value associated with the first value, wherein the control logic is structured to base the duty-cycle on the second value.

12. A pump as in claim 10, wherein the duty-cycle is greater than 40% when the voltage is less than 140 VAC and is less than 40% when the voltage is greater than 140 VAC.

13. A pump as in claim 10, wherein the pump comprises a solenoid pump including a switch-mode power supply powering the control logic.

14. A pump as in claim 10, wherein the first opto-coupler state transition corresponds to a voltage value of the power source exceeding a threshold amplitude which is greater than zero volts.

15. A pump as in claim 10, wherein the first opto-coupler includes an output contact configured to provide the first output signal.

16. A pump as in claim 11, the control logic structured to activate the power switch at a time corresponding to the second value to operate the pump at the duty-cycle.

17. A control circuit comprising:
a first opto-coupler having an input positive contact and an input negative contact, the first opto-coupler changing output state responsive to current flowing from a power source through the input positive contact to the input negative contact;
a second opto-coupler;
a first diode adapted to be electrically coupled to the power source and being electrically coupled to the input positive contact of the first opto-coupler to activate and change the output state of the first opto-coupler in response to a voltage of the power source exceeding a breakdown voltage of the first diode during a positive half-cycle of the voltage, the first opto-coupler providing a first output signal responsive to said activation;
a second diode coupled to activate the second opto-coupler in response to a zero-crossing of the voltage, the second opto-coupler providing a second output signal responsive to said activation; and
control logic structured to activate a power switch at a duty-cycle based on an elapsed time between the first output signal and the second output signal.

18. A control circuit as in claim 17, wherein the first output signal and the second output signal are isolated from the voltage.

19. A pump as in claim 17, wherein the first output signal corresponds to a voltage value of the power source exceeding a threshold amplitude.

* * * * *